United States Patent
Tseng et al.

(10) Patent No.: US 10,957,687 B2
(45) Date of Patent: *Mar. 23, 2021

(54) ESD HARD BACKEND STRUCTURES IN NANOMETER DIMENSION

(71) Applicant: Taiwan Semiconductor Manufacturing Co., Ltd., Hsin-Chu (TW)

(72) Inventors: Jen-Chou Tseng, Jhudong Township (TW); Ming-Fu Tsai, Hsinchu (TW); Tzu-Heng Chang, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/817,984

(22) Filed: Mar. 13, 2020

(65) Prior Publication Data

US 2020/0219868 A1    Jul. 9, 2020

Related U.S. Application Data

(60) Continuation of application No. 16/202,403, filed on Nov. 28, 2018, now Pat. No. 10,629,588, which is a (Continued)

(51) Int. Cl.
*H01L 27/02* (2006.01)
*H01L 21/66* (2006.01)
(Continued)

(52) U.S. Cl.
CPC ........ *H01L 27/0292* (2013.01); *G01R 31/002* (2013.01); *G01R 31/2607* (2013.01);
(Continued)

(58) Field of Classification Search
CPC ..... H01L 23/60; H01L 23/62; H01L 23/5252; H01L 23/5256; H01L 23/49816;
(Continued)

(56) References Cited

U.S. PATENT DOCUMENTS 6,788,093 B2    9/2004  Aitren et al.
7,646,207 B2    1/2010  Lin et al.
(Continued)

FOREIGN PATENT DOCUMENTS

| KR | 20020008879 A | 2/2002 |
| KR | 20080068346 A | 7/2008 |
| TW | 463442 B | 11/2001 |

OTHER PUBLICATIONS

Semtech. "SI96-05 Surging Ideas TVS Diode Application Note." Published Sep. 2000.
(Continued)

*Primary Examiner* — Chuong A Luu
(74) *Attorney, Agent, or Firm* — Eschweiler & Potashnik, LLC

(57) ABSTRACT

Some embodiments relate to a semiconductor device on a substrate. An interconnect structure is disposed over the semiconductor substrate. A first conductive pad is disposed over the interconnect structure. A second conductive pad is disposed over the interconnect structure and spaced apart from the first conductive pad. A third conductive pad is disposed over the interconnect structure and spaced apart from the first and second conductive pads. A first ESD protection element is electrically coupled between the first and second conductive pads. A first device under test (DUT) is electrically coupled between the first and third conductive pads.

20 Claims, 8 Drawing Sheets

Related U.S. Application Data division of application No. 15/271,272, filed on Sep. 21, 2016, now Pat. No. 10,170,461.

(60) Provisional application No. 62/255,739, filed on Nov. 16, 2015.

(51) Int. Cl.
  *G01R 31/00* (2006.01)
  *G01R 31/26* (2020.01)
  *H01L 23/498* (2006.01)
  *H01L 23/525* (2006.01)

(52) U.S. Cl.
  CPC .............. *H01L 22/14* (2013.01); *H01L 22/32* (2013.01); *H01L 22/34* (2013.01); *H01L 23/49816* (2013.01); *H01L 23/49827* (2013.01); *H01L 23/49838* (2013.01); *H01L 23/5256* (2013.01); *H01L 27/0251* (2013.01); *H01L 27/0255* (2013.01); *H01L 2224/11* (2013.01)

(58) Field of Classification Search
  CPC .............. H01L 27/0255; H01L 27/0248; H01L 27/0292; H01L 27/11206; H01L 27/02; H01L 27/0251; H01L 27/0259; H01L 27/0262; H01L 27/0266; H01L 27/0617; H01L 27/0623; H01L 27/0629; H01L 27/0635; H01L 23/49827; H01L 22/14; H01L 22/32; H01L 22/34; H01L 2227/11; G01R 31/002; G01R 31/2607
  USPC .......................................... 257/255, 355, 356
  See application file for complete search history.

(56) References Cited

U.S. PATENT DOCUMENTS

| | | | |
|---|---|---|---|
| 8,648,592 | B2 | 2/2014 | Lin et al. |
| 8,754,508 | B2 | 6/2014 | Chen et al. |
| 10,629,588 | B2 * | 4/2020 | Tseng ................ H01L 23/49816 |
| 2007/0081282 | A1 | 4/2007 | Li et al. |
| 2008/0197870 | A1 | 8/2008 | Koerner |
| 2010/0015326 | A1 | 1/2010 | Feldman et al. |
| 2012/0153437 | A1 | 6/2012 | Chen et al. |
| 2014/0151809 | A1 | 6/2014 | Lin et al. |
| 2014/0204490 | A1 | 7/2014 | Mellinger et al. |
| 2015/0311192 | A1 | 10/2015 | Lin et al. |

OTHER PUBLICATIONS

Tonti, William. "eFuse Design and Reliability." IEEE International Integrated Reliability Workshop Final Report, 2008. IRW 2008. Feb. 27, 2009.
Notice of Allowance dated Oct. 29, 2018 for U.S. Appl. No. 15/271,272.
Notice of Allowance dated Dec. 18, 2019 for U.S. Appl. No. 16/202,403.

* cited by examiner

900

1000

1100

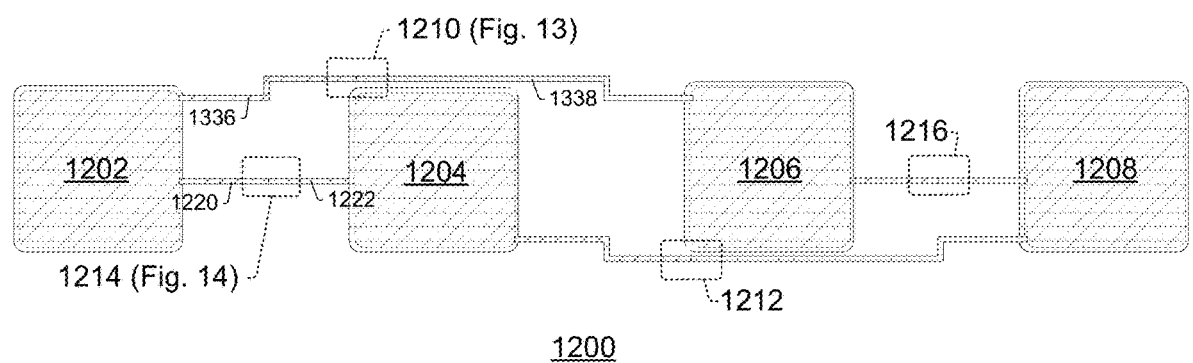
FIG. 12
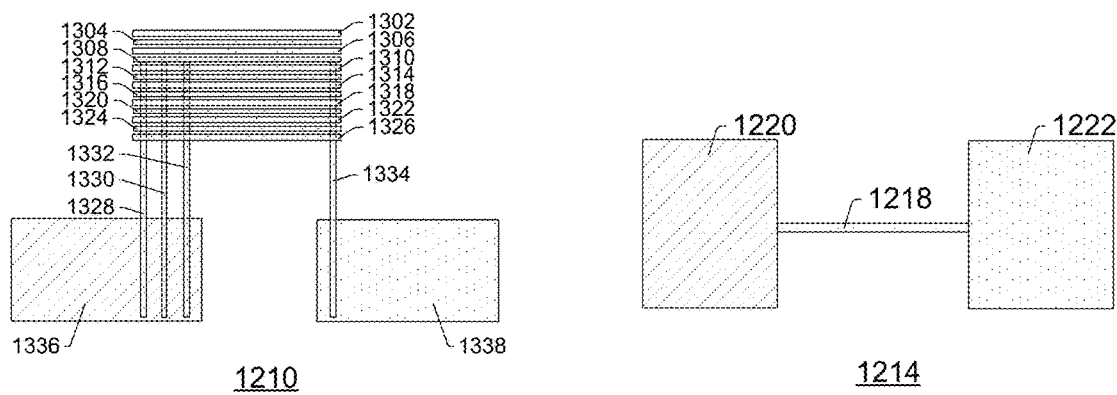
FIG. 13     FIG. 14

ESD HARD BACKEND STRUCTURES IN NANOMETER DIMENSION

REFERENCE TO RELATED APPLICATIONS

This Application is a Continuation of U.S. application Ser. No. 16/202,403, filed on Nov. 28, 2018, which is a Divisional of U.S. application Ser. No. 15/271,272, filed on Sep. 21, 2016 (now U.S. Pat. No. 10,170,461, issued on Jan. 1, 2019), which claims the benefit of U.S. Provisional Application No. 62/255,739, filed on Nov. 16, 2015. The contents of the above-referenced Patent Applications are hereby incorporated by reference in their entirety.

BACKGROUND

Integrated circuits (ICs), which often include millions or billions of semiconductor devices packaged within a single chip, are an underlying technology for modern computers and mobile electronic devices. These ICs and their underlying semiconductor devices have in large part been responsible for ushering in the modern communications age.

Semiconductor devices of ICs can be damaged by electrostatic discharge (ESD) events. Such ESD events can occur when static electricity is suddenly discharged from a body surface to a device. For example, during manufacturing or testing of ICs, an ESD event can occur between an engineer's finger and a semiconductor wafer on which a semiconductor device is located, causing a sudden in-rush of current or voltage to strike the semiconductor device. This sudden in-rush of current or voltage can catastrophically damage the device in a number of ways, such as blowing out a gate oxide or causing junction damage, for example. ESD protection circuits have been developed to protect against such ESD events.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12 illustrates a layout relating to a test pad configuration in accordance with some embodiments.

FIG. 13 illustrates a layout view of a DUT consistent with FIG. 12 in accordance with some embodiments.

FIG. 14 illustrates a layout view of a fuse consistent with FIG. 12 in accordance with some embodiments.

DETAILED DESCRIPTION

Figure 1:
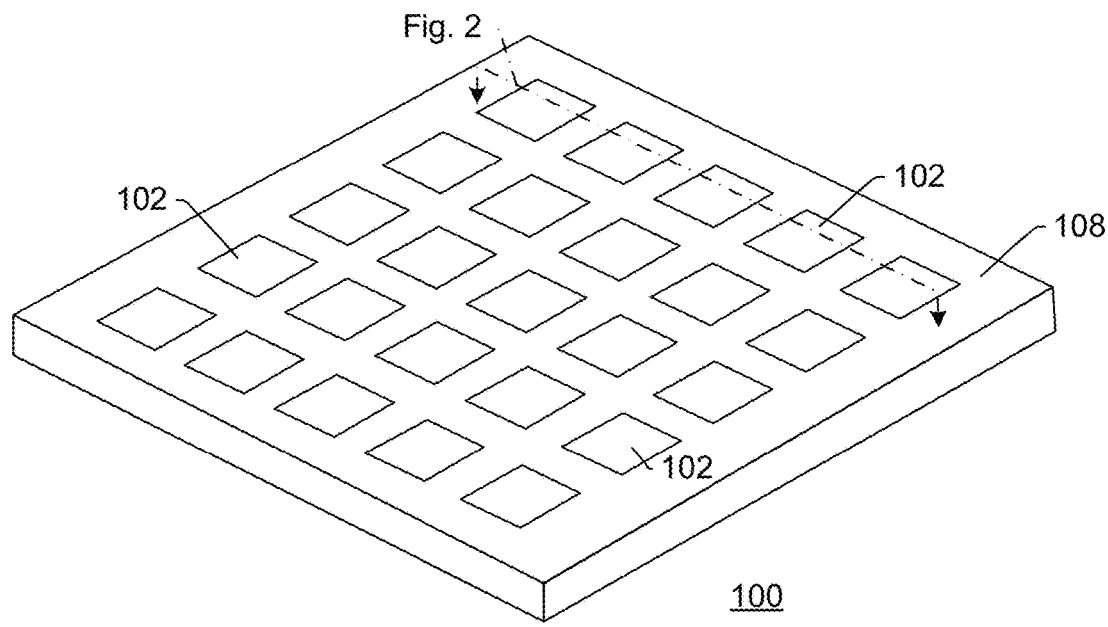
FIG. 1 illustrates a perspective drawing of a chip that includes a number of conductive pads in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuits (ICs) include one or more semiconductor devices arranged in and/or on a semiconductor substrate. To implement desired functionality in electronic devices (such as cell phones, computers, automotive control systems, and the like), ICs can be coupled to one another and/or can be coupled to external circuitry through conductive pads. As used herein, the term "conductive pad" can include a conductive bump, a conductive ball such as a solder ball, or some other conductive pad, pin, or bump with a rounded, planar, or substantially planar conductive surface, and/or can include a conductive landing pad configured to be contacted by a wafer probe, network analyzer, etc.

Figure 2:
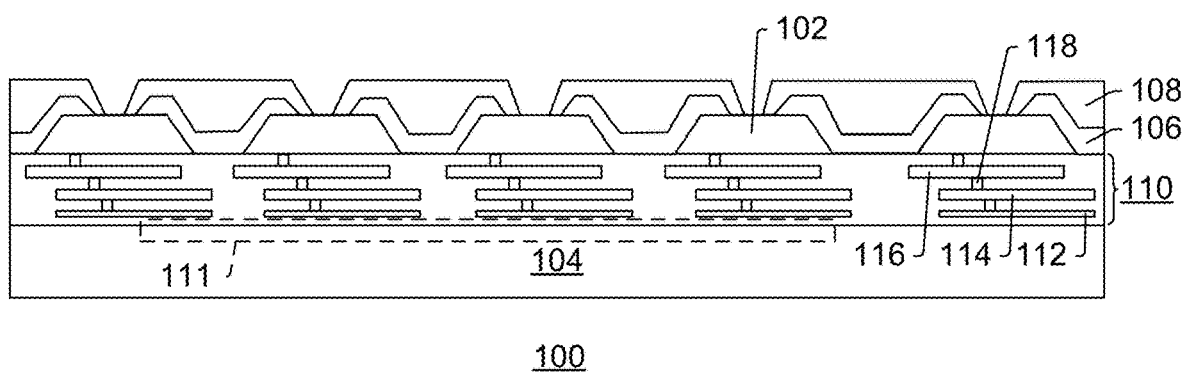
FIG. 2 illustrates a cross-sectional view of the chip of FIG. 1 in accordance with some embodiments.

FIG. 1 shows an example of a chip 100 having an arrangement of conductive pads 102 which can connect an integrated circuit (IC) included in the chip 100 to external circuitry, such as another IC, a probe tester, a breadboard, or a printed circuit board for example. FIG. 2 shows a cross-sectional view of FIG. 1's chip 100 and its conductive pads 102. It will be appreciated that the chip 100 and its conductive pads 102 of FIGS. 1-2 merely illustrate a general example which does not limit the present disclosure in any way. The present disclosure is applicable to any type of chip at various stages of manufacture, including fully or partially fabricated chips included on a semiconductor wafer prior to dicing, 3DICs with multiple substrates that are stacked over one another, chips which are in the process of being diced/packaged, and/or diced and fully packaged chips, such a packaged chip in a dual in-line package (DIP), flip-chip package, ball grid array package, contactless package, through-hole package, and/or surface mount package, among others.

As shown in FIG. 2, chip 100 includes a semiconductor substrate 104 that includes one or more semiconductor devices 111 (such as transistors, diodes, etc., where details of the semiconductor devices 111 have been omitted for simplicity/clarity). A passivation layer 106 and/or polymer layer 108 are optionally present, depending on to what extent the chip has been fabricated. One or more of the semiconductor devices and/or other features on the chip are configured to be electrically connected to a corresponding conductive pad 102 through a conductive path. In FIG. 2's example, the conductive path includes an interconnect structure 110, which is made up of a number of metal layers stacked over one another and which are connected to one another through conductive vias. In the illustrated example of FIG. 2, the interconnect structure includes a metal 1 line 112, a metal 2 line 114, and a metal 3 line 116, which are electrically coupled by vias 118. It will be appreciated, however, that any number of metal layers may be present depending on the implementation. Although the conductive pads 102 can operably couple the semiconductor devices 111 to one or more external circuits, the conductive pads 102 also make the semiconductor devices 111 and/or other features on the chip susceptible to ESD events from the external environment.

ESD stress during manufacturing and packaging of chips is a serious threat, especially in technology nodes where IC features are on the order of nanometers. For example, in current technology nodes, where minimum feature sizes can be less than 20 nm or even less than 10 nm, one or more metal lines of interconnect structure 110 can have a width corresponding to the minimum feature size, and/or adjacent metal lines can be spaced so their pitch also corresponds to the minimum feature size. An advantage of "shrinking" these metal lines 112-116, compared to metal lines of previous technology nodes, is that thinner, more closely spaced metal lines allow the devices on the chip to be packed more densely together. Unfortunately, the thinner, more closely spaced metal lines are extremely fragile and vulnerable, and accordingly, are more susceptible to damage due to ESD events. In particular, metal 1 line 112, which is often thinner than higher metal lines on the IC (e.g., thinner than metal 2 line 114, and thinner than metal 3 line 116), can be damaged more easily than other metal lines and via structures.

The thinness of the metal 1 line 112 is particularly problematic when electromigration tests are to be carried out to characterize the metal 1 lines 112 and/or other features of the chip 100. Electromigration is the transport or "erosion" of material, such as metal atoms from metal 1 line 112, caused by the gradual movement of the metal atoms due to momentum transfer between conducting electrons and diffusing metal atoms. For modern ICs where metal 1 lines are very thin, electromigration tests are very difficult to conduct due to the fragility of the metal 1 lines. One approach to allow for electromigration testing of a metal 1 line is to enlarge the length of metal 1 line to increase the parasitic resistance and reduce the failure rate. However, short metal lines having a length of less than 120 micrometer cannot be monitored by such an approach, and a long line (such as 120 micrometers in length) does not accurately reflect typical on-chip structures, since metal 1 lines are short in practical interconnect structures 110.

Therefore, the present disclosure provides techniques through which a metal 1 line 112, which is one example of a device under test (DUT), can be tested while limiting risk of ESD damage and still reflecting typical on-chip metal 1 line lengths used in production ICs. In some embodiments, the disclosure provides a test pad configuration in which an arrangement of conductive pads, which make use of ESD protection devices and fuses, diverts at least a portion of the energy of any ESD pulse away from a short metal 1 line under test during manufacturing. Then, after manufacturing is complete and the manufacturer wants to run electromigration tests, the manufacturer can blow the fuses and then run the electromigration tests on the short metal 1 line. Because the fuses are blown, the ESD devices do not interfere with the electromigration test results. The concept is not limited to metal 1 lines as DUT, but can also be used for other DUTs, including but not limited to: metal 2 line 114, metal 3 line 116, higher or lower metal lines, as well as other device structures.

Figure 3A:
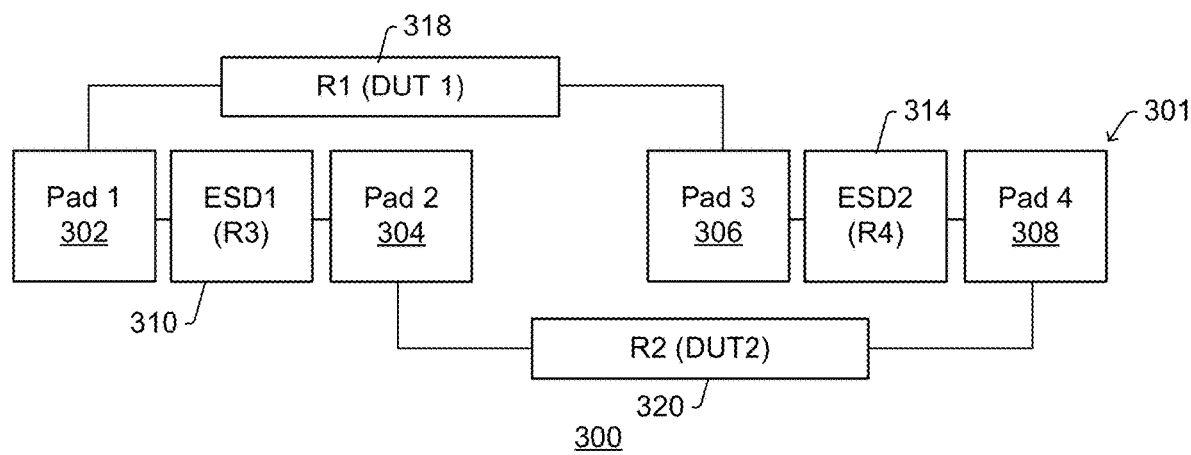
FIG. 3A illustrates a schematic diagram of test pad configuration in accordance with some embodiments.

FIG. 3 shows a portion of a chip 300 exhibiting a test pad configuration according to some embodiments. The test pad configuration includes a series of conductive pads 301, namely: first conductive pad 302, second conductive pad 304, third conductive pad 306, and fourth conductive pad 308. A first ESD protection element 310 is electrically coupled between the first conductive pad 302 and the second conductive pad 304. A second ESD protection element 314 is electrically coupled between the third conductive pad 306 and the fourth conductive pad 308. A first device under test (DUT) 318, which can manifest as a first short metal 1 line having a first resistance R1 in some embodiments, is electrically coupled between the first and third conductive pads (302, 306), and a second DUT 320, which can manifest as a second short metal 1 line having a second resistance R2 in some embodiments, is electrically coupled between the second and fourth conductive pads (304, 308). The first ESD protection element 310 has a third resistance, R3; and the second ESD protection element has a fourth resistance, R4. In some embodiments, R1 and R2 are equal to one another, and are greater than R3 and R4. R1 and R2 can alternatively differ from one another, and R3 and R4 can be equal or un-equal different depending on the implementation. The first conductive pad 302, the first DUT 318, the third conductive pad 306, the second ESD protection element 314, the fourth conductive pad 308, the second DUT 320, the second conductive pad 304, and the first ESD protection element 310 are arranged as a closed current loop in some embodiments.

Figure 4:
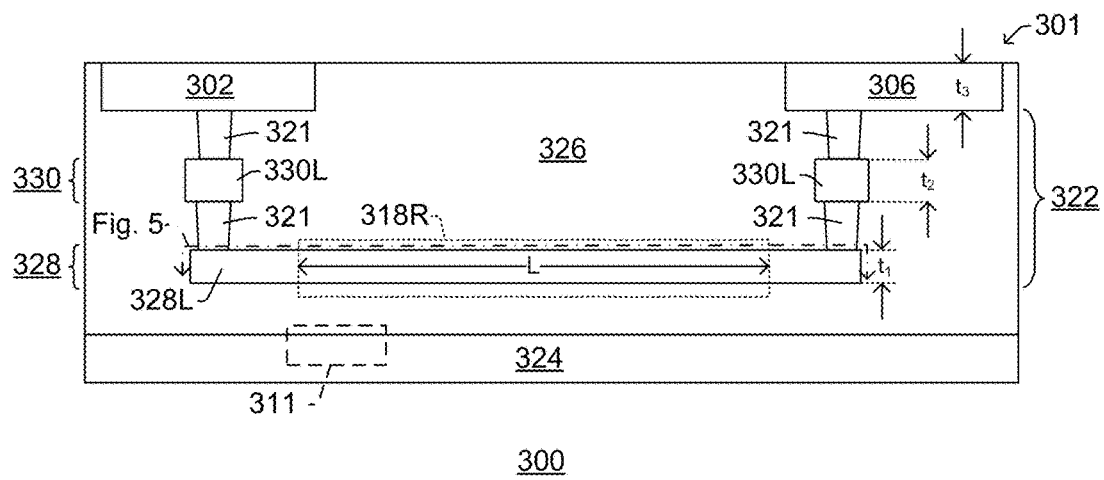
FIG. 4 illustrates a cross-sectional view of a portion of a test pad configuration in accordance with some embodiments.

Referring briefly to FIG. 4, the conductive pads 301, for example the first conductive pad 302 and third conductive pad 306, are disposed over an interconnect structure 322 and over a semiconductor substrate 324, such as a bulk monocrystalline silicon substrate or a semiconductor-on-insulator (SOI) substrate. The interconnect structure 322 can include a dielectric structure 326 such as silicon dioxide or a low-k dielectric material, and multiple metal layers arranged in the dielectric structure and which are connected by vias 321 extending vertically between adjacent metal layers. A lowermost metal layer 328 (e.g., a metal 1 layer) can include a metal 1 line 328L having a first thickness, $t_1$, which is 20 nm or less for example; and an upper metal layer 330 (e.g., a metal 2 layer) can include metal2 lines 330L having a second thickness, $t_2$, which is greater than the first thickness to help reduce current crowding effects. Additional metal layers (not shown) can also be arranged over the upper metal layer 330 and below the conductive pads 301. The conductive pads 301 often have a third thickness, $t_3$, which is greater than each of the first and second thicknesses $t_1$, $t_2$. The metal layers and conductive pads are often made of metal, such as copper or a copper alloy, for example.

Figure 5:
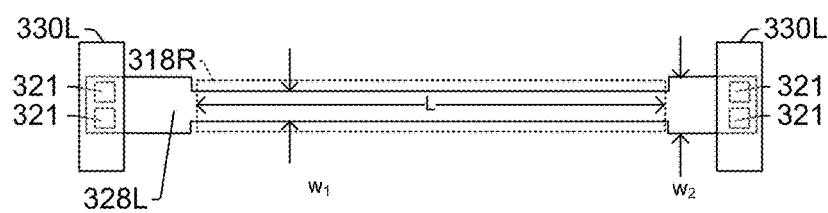
FIG. 5 illustrates a top view of a device under test (DUT) of a test pad configuration in accordance with some embodiments.

In some embodiments, the lowermost metal layer 328 can have a DUT region 318R corresponding to the first DUT 318 which exhibits a thickness $t_1$ of less than 20 nm, and a length of 120 micrometers or less from nearest edges of vias contacting an upper surface of the lowermost metal layer 328. In some embodiments, the DUT region 318R can be electrically isolated from semiconductor devices 311 on the semiconductor substrate 324, which can allow accurate testing of the DUT region 318R to occur exclusively through the conductive pads 301. As shown in FIG. 5, in some embodiments the DUT region 318R can taper inwardly so the DUT region 318R has a first width, $w_1$, of about 20 nm or less, while neighboring regions of the metal 1 line 328L are wider, for example by a factor of two or three or more, and have a second width, $w_2$, that is greater than the first width, $w_1$. In some embodiments, DUT region 318R corresponds to a metal 1 line having first and/or second widths $w_1$, $w_2$, ranging from 10 nm to approximately 500 nm, and a length, L, of approximately 790 nm. In some embodiments, the resistance (Rdut) of the first DUT 318 and/or second DUT 320 is approximately 360 ohm. The first and/or second ESD protection element 310, 314 can be an Efuse (metal 1, W/L=20 nm~0.5 um/0.55 um) having a resistance (Rfuse) of approximately 165 ohm.

Figure 3B:
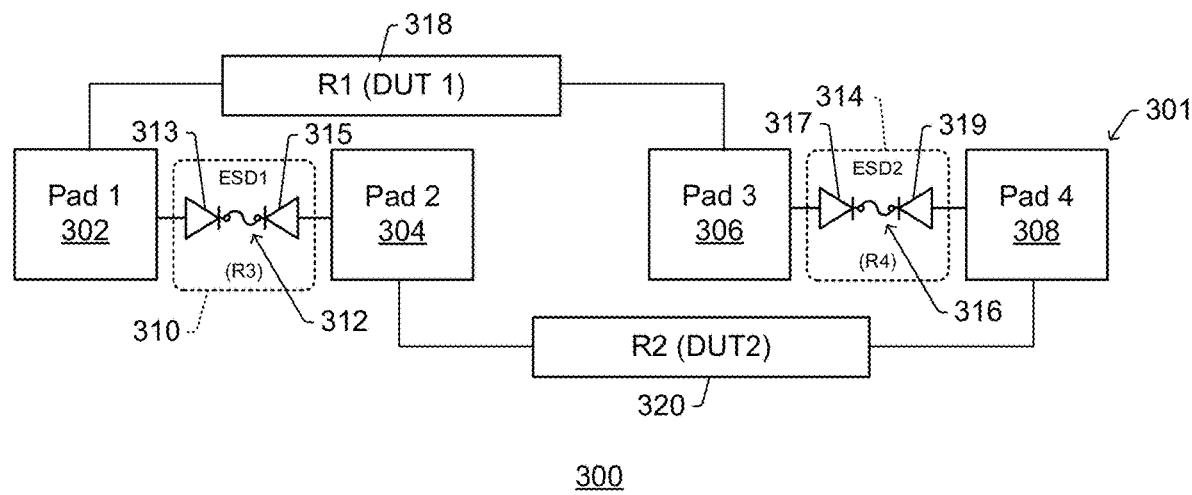
FIG. 3B illustrates a schematic diagram of test pad configuration in accordance with other embodiments.
Figure 3C:
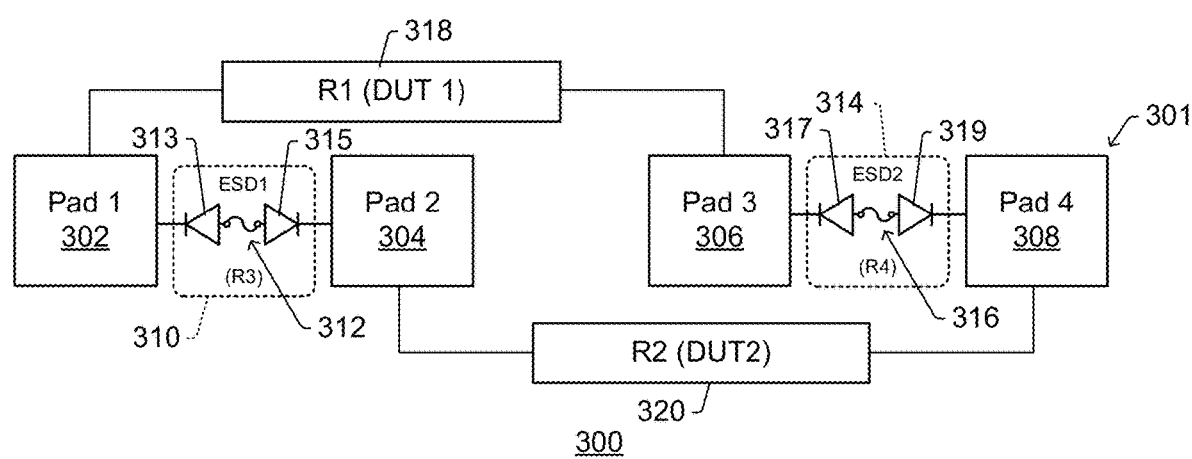
FIG. 3C illustrates a schematic diagram of test pad configuration in accordance with other embodiments.

In general, the ESD protection elements 310, 314, can be bidirectional devices that allow current to flow through each of them in both directions. For example, the ESD protection elements 310, 314 can be implemented as NPN or PNP bipolar junction transistors (BJTs), p-type or n-type MOSFETs, silicon controlled rectifiers (SCRs), Schottky diodes or avalanche diodes. Referring briefly to FIG. 3B's embodiment, one can see an example where the first ESD protection element 310 includes a first fuse 312 and first and second diodes 313, 315; and where the second ESD protection element 310 includes a second fuse 316 and third and fourth diodes 317, 319. FIG. 3C illustrates another example where the first and second diodes 313, 315 are arranged in the opposite directions, as are the third and fourth diodes 317, 319. It will be appreciated that although FIGS. 3B and 3C depict first and second fuses 312, 316 as being arranged in series between diodes, the first and second fuses 312, 316 can be an inherent property of these bidirectional devices and are not necessary a separately patterned structure.

Figure 6:
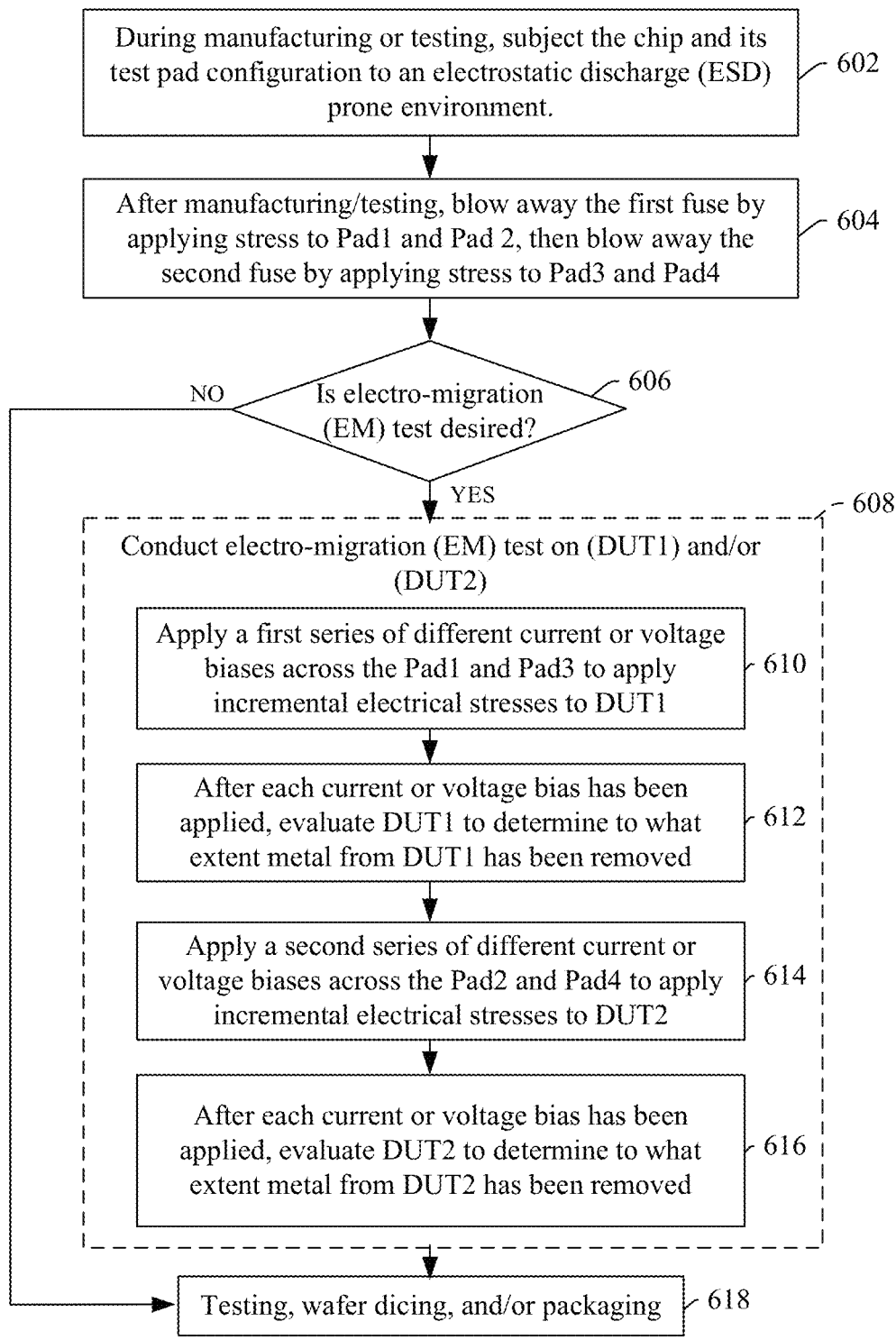
FIG. 6 illustrates some embodiments of a method of testing a chip in accordance with a test pad configuration.

FIG. 6 shows a methodology illustrating how the test pad configuration of FIG. 3 can be used as a part of a testing and/or manufacturing process for ICs. While the method described by the flowchart 600 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In 602, during manufacturing or testing, the chip 300 with its test pad configuration is exposed to an electrostatic discharge (ESD) prone environment. For example, the chip 300 can be handled by an engineer or placed on a wafer probe apparatus in which one or more wafer probes are placed into electrical contact with one or more conductive pads 301. Because this environment may subject the chip 300 to ESD events, the first and second fuses 312, 316 are un-blown at this time, such that the first ESD protection element 310 provides a conductive path between the first conductive pad 302 and the third conductive pad 306, and the second ESD protection element 314 provides a conductive path between the second conductive pad 304 and the fourth conductive pad 308. If an ESD event occurs, the first and second ESD protection elements 310, 314 reliably dissipate the energy of the ESD event. For example, if $R1 \approx R3+R2+R4$ and if the first and third conductive pads 302, 306 are grounded and a positive ESD pulse event strikes the first conductive pad 302, the ESD current can be split into two equal parts as it strikes the chip at 302 (and leaves the chip at 306). Thus, a first portion of the ESD current can flow over R1, and a second portion of the ESD current can flow over first ESD protection element 310 and can continue over the second ESD protection element 314. In particular, the second portion of the ESD current can flow over first ESD protection element 310 when second diode 315 conducts in the forward direction and first diode 313 is reversed biased and conducts through avalanche breakdown; and the ESD current continues through the second ESD protection element 314 when fourth diode 319 is reversed biased and conducts through avalanche breakdown and third diode 317 conducts in the forward direction. Rather than the ESD current "spiking" over the first DUT 318 or the second DUT 320, the current can be split, for example approximately equally under this four pads scheme, which limits ESD stress on the first and second DUTs 318, 320 and correspondingly limits ESD-induced damage and/or electromigration.

The ESD current distributions can be as follows. For stress between the first conductive pad 302 and the second conductive pad 304:

$$I_{R1}=I_{PAD1}*(R_3)/(R_1+R_2+R_3+R_4);$$

$$I_{R3}=I_{PAD1}*(R_1+R_2+R_4)/(R_1+R_2+R_3+R_4)$$

For stress between the first conductive pad 302 and the third conductive pad 306:

$$I_{R1}=I_{PAD1}*(R_2+R_3+R_4)/(R_1+R_2+R_3+R_4);$$

$$I_{R3}=I_{PAD1}*(R_1)/(R_1+R_2+R_3+R_4)$$

For stress between the first conductive pad 302 and the fourth conductive pad 308:

$$I_{R1}=\tfrac{1}{2}*I_{PAD1};$$

$$I_{R3}=\tfrac{1}{2}*I_{PAD1}$$

It will be appreciated that in some embodiments R1 is approximately equal to R3+R2+R4 as set forth in the example just described. However, strict equality is not required, and it will be appreciated that R1 can also differ from R3+R2+R4. For example, R1 can be one or more orders of magnitude greater than R3+R2+R4 in some embodiments. In other embodiments, R1 can be greater than R3+R2+R4 by 1%-500% in some embodiments, or by 5%-200% in other embodiments, or by 10%-100% in still other embodiments. The more equal R1 is to R3+R2+R4, the more equally ESD current will be split over the first DUT 318 and second DUT 320 in the example above. However, even if current is not split equally, the diversion of some ESD current away from either first DUT 318 and/or second DUT 320 can help limit ESD-induced damage and/or electromigration, and thus R1 can vary from R3+R2+R4 (sometimes significantly) and still provide improved functionality.

In 604, after manufacturing and/or testing, the first and second fuses 312, 316 are blown, thereby breaking the current path where the first and second fuses are located. The first fuse 312 can be blown by placing wafer probes into electrical contact with the first conductive pad 302 and the second conductive pad 304. The wafer probes then apply an electrical stress across the first and second conductive pads 302, 304, where the applied electrical stress is in the form of a current and/or voltage of sufficient magnitude to blow the first fuse 312. For example, if we want to trim the first fuse 312, the stress can be applied on the first and second conductive pads 302, 304. The resistance in ESD fuse path will be R3. In another path, the resistance is not R1 only, but R1+R4+R2. Thus, when R1 is approximately equal to R3+R2+R4, the resistance in the ESD fuse path is R3 and the resistance in the other path (by simple substitution) is (R3+R2+R4)+R4+R2, which is clearly greater than R3. This means most of current can be shunted to the first fuse 312 under trimming, whereas the DUTs 320 and 318 can sustain the rest of current ($R_{DUT\_path} > R_{fuse\_path}$).

Similarly, the second fuse 316 can be blown by placing wafer probes into electrical contact with the first and fourth conductive pads 306, 308, and applying electrical stress to the third and fourth conductive pads 306, 308. The wafer probes then apply an electrical stress across the third and fourth conductive pads 306, 308, where the applied electrical stress is in the form of a current and/or voltage of sufficient magnitude to blow the second fuse 316. For example, if we want to trim the second fuse 316, the stress can be applied on the third and fourth conductive pads 306, 308. The resistance in ESD fuse path will be R4. In another path, the resistance is not R2 only, but R1+R3+R2. Thus, when R1 is approximately equal to R3+R2+R4, the resistance in the ESD fuse path is R4 and the resistance in the other path (by simple substitution) is (R3+R2+R4)+R4+R2, which is clearly greater than R4. This means most of current can be shunted to the second fuse 316 under trimming, whereas the DUTs 320 and 318 can sustain the rest of current ($R_{DUT\_path} > R_{fuse\_path}$).

In 606, a determination is made as to whether electromigration testing is to be carried out on first DUT 318 and/or second DUT 320.

If so (i.e., "YES" at 606), electromigration testing is carried out on first DUT 318 and/or second DUT 320 in block 608. If not (i.e., "NO" at 606), the method continues to 618 where additional testing, such as JTAG scanning, vector testing, and/or other chip verification and/or characterization is performed; and/or wafer dicing; and/or packaging can be performed. Because electromigration testing can be carried out at various stages, note that these operations in block 618 are optional, and/or may be omitted and/or carried out prior to electromigration testing in block 608.

In 610, to conduct electromigration testing on first DUT 318, a first series of different current or voltage biases are applied across the first conductive pad 302 and third conductive pad 306. Thus, incremental electrical stresses are applied to first DUT 318.

In 612, after each current or voltage bias has been applied, first DUT 318 is evaluated to determine to what extent metal from first DUT 318 has been removed. For example, scanning electron microscopy (SEM) techniques can be used to inspect the chip after the current or voltage has been applied, and the amount of electromigration can be determined based on changes in first DUT 318 before and after the testing. For example if first DUT 318 is a metal 1 line which has an initial width of 20 nm and an initial length of 120 nm, a SEM measurement indicating the thickness of the metal 1 line has been reduced to 5 nm would indicate a significant amount of electromigration has occurred. Rather than SEM measurements, resistance measurements of first DUT 318 can also be carried out to determine the extent of electromigration, if any. For example if a first DUT 318 metal 1 line had an initial resistance of 360 ohm, and after testing the resistance increased to 1 kilo-ohm, a significant amount of electromigration has likely occurred.

In 612, a second series of different current or voltage biases are applied across second conductive pad 304 and fourth conductive pad 308 to apply incremental electrical stresses to second DUT 320. This second series of different current or voltage biases can be the same as the first series of different current or voltage biases, or can be different from the first series of different current or voltage biases.

Figure 7:
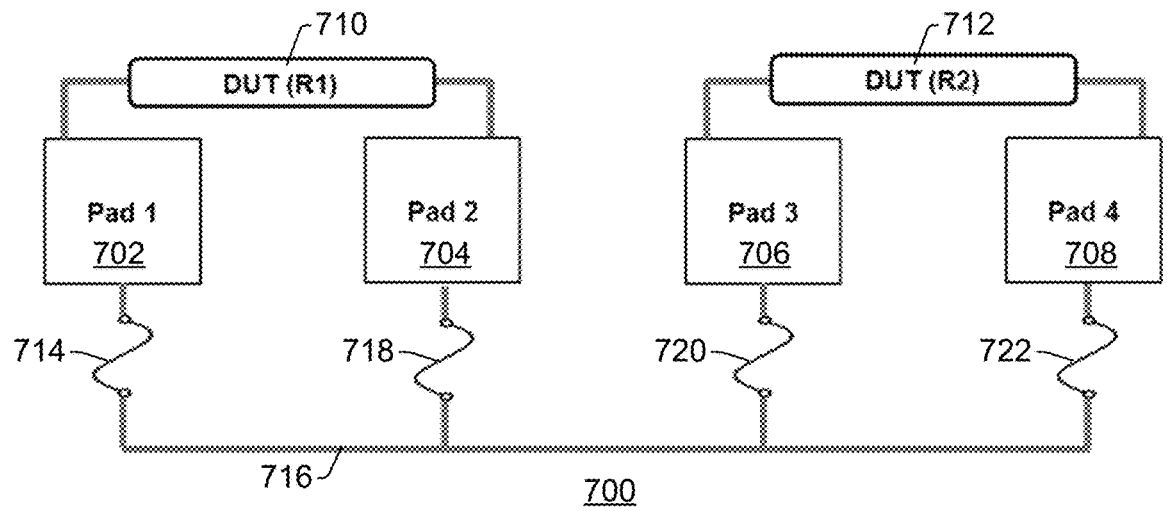
FIG. 7 illustrates a schematic diagram of another test pad configuration in accordance with some embodiments.

In 614, after each current or voltage bias has been applied, evaluate second DUT 320 to determine to what extent metal from second DUT 320 has been removed FIG. 7 shows another test pad configuration 700 in accordance with some embodiments. The test pad configuration 700 includes a first conductive pad 702, second conductive pad 704, third conductive pad 706, and fourth conductive pad 708. A first DUT 710 is coupled between the first and second conductive pads, and a second DUT 712 is coupled between the third and fourth conductive pads. A first fuse 714 is coupled between the first conductive pad 702 and a shared node 716. A second fuse 718 is coupled between the second conductive pad 704 and the shared node 716. A third fuse 720 is coupled between the third conductive pad 706 and the shared node 716. A fourth fuse 722 is coupled between the fourth conductive pad 708 and the shared node 716.

Figure 8:
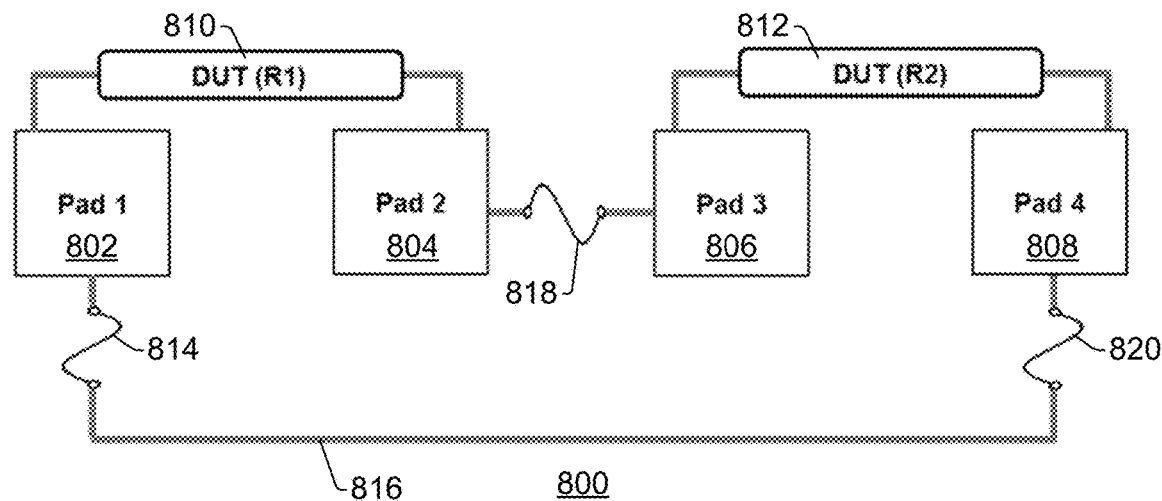
FIG. 8 illustrates a schematic diagram of another test pad configuration in accordance with some embodiments.

FIG. 8 shows another alternative test pad configuration 800 in accordance with some embodiments. The test pad configuration 800 includes a first conductive pad 802, second conductive pad 804, third conductive pad 806, and fourth conductive pad 808. A first DUT 810 is coupled between the first and second conductive pads, and a second DUT 812 is coupled between the third and fourth conductive pads. A first fuse 814 is coupled between the first conductive pad 802 and a shared node 816. A second fuse 818 is coupled between the second conductive pad 804 and the third conductive pad 806. A third fuse 820 is coupled between the fourth conductive pad 808 and the shared node 816.

Figure 9:
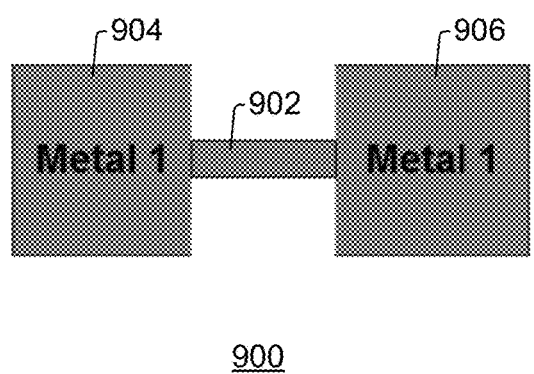
FIG. 9 illustrates an example layout of a fuse in accordance with some embodiments.

FIGS. 9-12 show several examples of ways in which a fuse (e.g., first fuse 312 and/or second fuse 316 in FIG. 3) can be implemented in accordance with some embodiments. FIG. 9 shows a top view of a fuse 900 in accordance with some embodiments. The fuse 900 is formed in a single metal layer (e.g., metal 1 layer), and includes a narrow strip 902 arranged between first and second fuse terminals 904, 906, which are wide compared to the narrow strip 902. So long as the current between the first and second fuse terminals 904, 906 is less than some maximum threshold, the narrow strips 902 remains intact. To "blow" the fuse, current in excess of the maximum threshold is provided from one of the fuse terminals through the narrow strip 902 and out of the other fuse terminal. Because the narrow strip 902 has a smaller cross-sectional area through which current flows, current entering the narrow strip 902 is "crowded" together and causes heating and stress that erodes the narrow strip 902, thereby "blowing" the fuse 900 and breaking the electrical connection between the first and second fuse terminals 904, 906.

Figure 10:
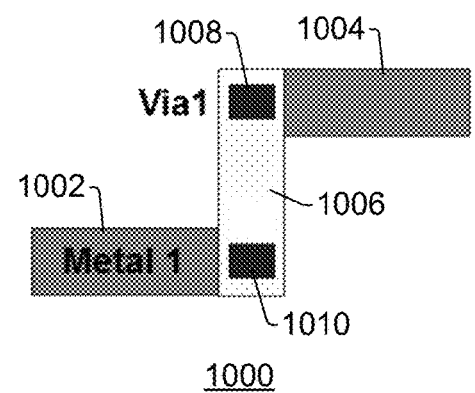
FIG. 10 illustrates an example layout of a fuse in accordance with some embodiments.

FIG. 10 shows a top view of another fuse 1000 in accordance with some embodiments. The fuse includes first and second metal 1 segments 1002, 1004 extending in a first direction (e.g., x-direction), and a metal2 segment 1006 extending in a second direction. Vias 1008, 1010 electrically couple the metal 2 segment 1006 to the first and second metal 1 segments 1002, 1004. So long as the current between the first and second metal 1 segments is less than some maximum threshold, the vias 1008, 1010 remain intact. To "blow" the fuse, current in excess of the maximum threshold is provided from one of the metal 1 segments through the vias and metal 2 segment and out of the other metal 1 segment. The vias 1008, 1010 are arranged to have a smaller cross-sectional area than the metal 1 and metal 2 segments, such that current entering the vias is "crowded" together and causes heating and stress that erodes the vias, thereby "blowing" the fuse and breaking the electrical connection between the first and second metal 1 segments.

Figure 11:
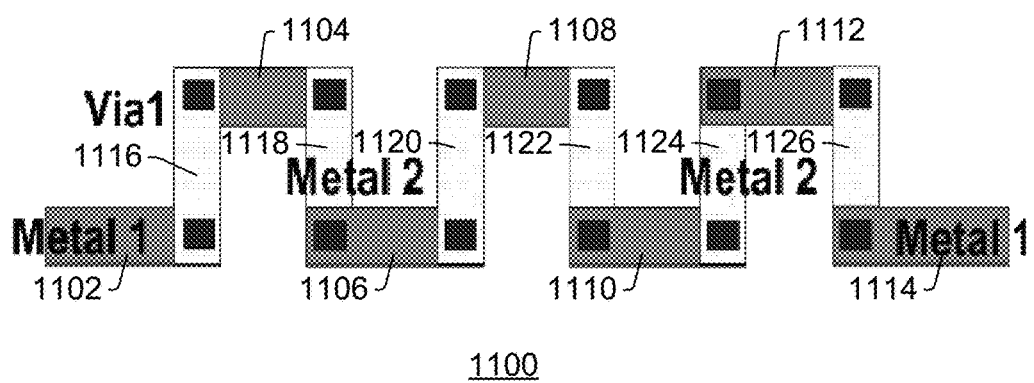
FIG. 11 illustrates an example layout of a fuse in accordance with some embodiments.

FIG. 11 shows a top view of another fuse 1100 in accordance with some embodiments. The fuse includes multiple metal 1 segments 1102-1114 extending in a first direction (e.g., x-direction), and a multiple metal2 segments 1116-1126 extending in a second direction and being coupled to the metal 1 segments through vias. So long as the current between an input fuse terminal (e.g., leftmost metal 1 segment 1102) and an output fuse terminal (e.g., rightmost metal 1 segment 1114) is less than some maximum threshold, the fuse remains intact. To "blow" the fuse, current in excess of the maximum threshold is provided into an end portion of the input fuse terminal (e.g., 1102), then passes through the vias and metal 2 segments before passing out of the output fuse terminal (e.g., 1114). The vias are arranged to have a smaller cross-sectional area than the metal 1 and metal 2 segments, such that current entering the vias is "crowded" together and causes heating and stress that erodes the vias, thereby "blowing" the fuse and breaking the electrical connection between input and output fuse terminals.

FIGS. 12-14 illustrate layout views of a test pad configuration in accordance with some embodiments, with FIG. 12 illustrating an overall layout view 1200 and FIG. 13 illustrating a more detailed view of a DUT 1210 and FIG. 14 illustrating a more detailed view of a first fuse 1214. FIG. 12's layout illustrates a test pad configuration with a first conductive pad 1202, second conductive pad 1204, third conductive pad 1206, and fourth conductive pad 1208. A first DUT 1210, which is shown in more detail in FIG. 13, is coupled between the first conductive pad 1202 and third conductive pad 1206, and a second DUT 1212 is coupled between the second conductive pad 1204 and fourth conductive pad 1208. A first ESD protection element, which includes a first fuse 1214 that is shown in more detail in FIG. 14, is coupled between the first conductive pad 1202 and second conductive pad 1204, and a second ESD protection element with a second fuse 1216 is coupled between the third conductive pad 1206 and the fourth conductive pad 1208. The first fuse 1214 includes a narrow strip 1218 arranged between an input fuse terminal 1220 and an output fuse terminal 1222.

The layout of FIGS. 12-14 can make use of "coloring" techniques to produce features on the order of nanometers—which provides densely-packed features, but which also leaves the features potentially susceptible to ESD damage. In "coloring" techniques, multiple masks are used for a single layer on the integrated circuit, such that the resultant single layer can have features that are more closely spaced than can be achieved with a single exposure photolithography step. For example, in some embodiments the first DUT 1210 illustrated in FIG. 13 can be made up of multiple horizontal conductive lines 1302-1326 which are formed in a single metal layer, such as a metal 1 layer. The horizontal conductive lines can alternate between two different colors in the vertical direction. Thus, a first conductive line 1302 can be a metal 1 line of a first color, a second conductive line 1304 can be a metal 1 line of a second color, a third conductive line 1306 can be a metal 1 line of the first color, a fourth conductive line 1308 can be a metal 1 line of the second color, and so on. Consequently, even if the lithography system used to form the conductive lines is capable of achieving some predetermined minimum resolution for a single mask step (such as nearest edges of neighboring metal 1 lines which are formed by a single mask being separated by 20 nm); lines of different colors can have edges that are separated by less than the predetermined minimum resolution (such as nearest edges of metal 1 lines of different colors being separated by only 10 nm).

Vertical lines 1328-1334, which are also formed in metal 1 in this example, operably couple the narrow horizontal lines of the first DUT 1210 to input and output DUT terminals (1336, 1338), which are wider than the horizontal conductive lines 1302-1326 and vertical lines 1328-1334. Thus, if electromigration tests are carried out on this first DUT 1210, one or more predetermined current pulses can be provided to the input DUT terminal 1336 through the first conductive pad 1202, for example, and the current can flow over the horizontal and vertical lines and then exit through the output terminal 1338. The amount of electromigration occurring for the horizontal lines due to this current can vary depending on small variations in the manufacturing process. Thus, this DUT structure provides a reliable manner of allowing electromigration to be evaluated, which has prior to this disclosure, been challenging, particularly at small feature sizes for technology nodes on the order of nanometers. In some embodiments, some of the horizontal lines (e.g., 1302-1306) are left isolated or decoupled from the vertical lines 1328-1334, such that when the first DUT 1210 is evaluated by visual inspection, these decoupled lines 1302-1306 serve as a baseline of sorts by which any electromigration for the coupled horizontal lines 1308-1326 can be compared.

Figure 15:
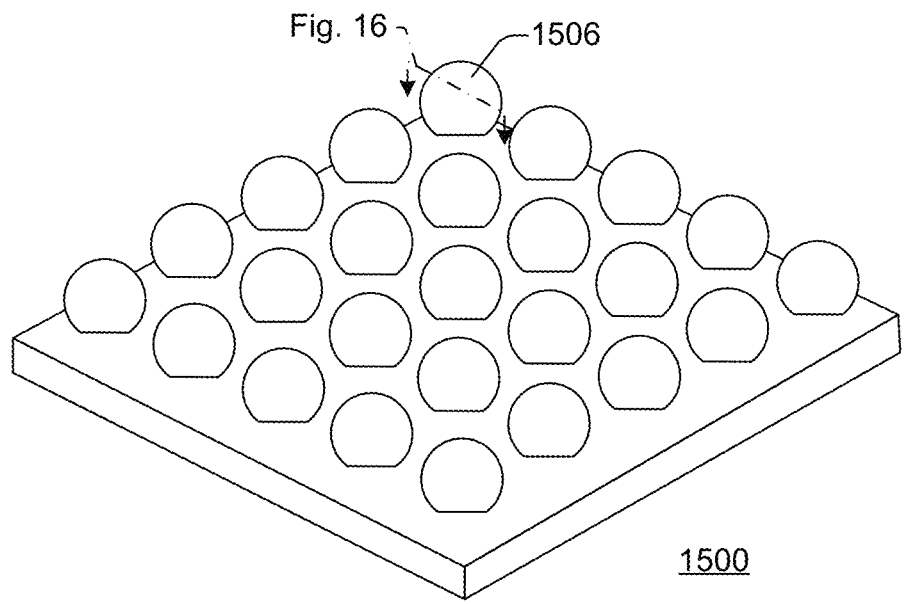
FIG. 15 illustrates a perspective drawing of a chip that includes a number of conductive pads in accordance with some embodiments.
Figure 16:
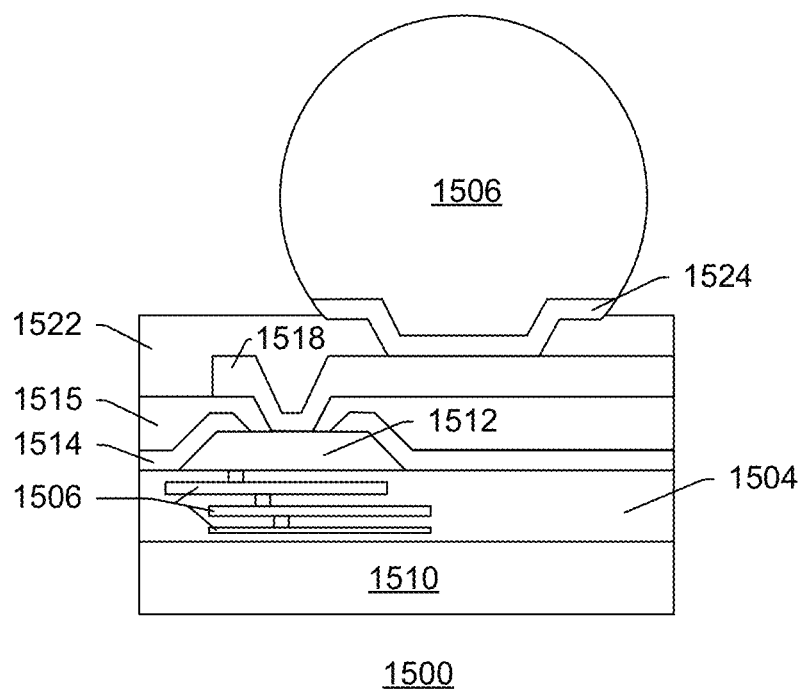
FIG. 16 illustrates a cross-sectional view of a chip of FIG. 15 in accordance with some embodiments.

FIG. 15-16 show an example of a chip 1500 having conductive pads in accordance with some embodiments. It will be appreciated that the test pad configurations previously described in FIGS. 3-14 can make use of the conductive pads as shown in FIGS. 15-16 in some embodiments. As can be seen in FIG. 15-16, a chip 1500 includes a substrate 1510 with integrated circuits formed therein and/or thereon. The substrate 1510 can manifest as a semiconductor substrate, including but not limited to a bulk silicon substrate, a semiconductor substrate, a silicon-on-insulator (SOI) substrate, or a silicon germanium substrate. Other semiconductor materials including group III, group IV, and group V elements are used for the substrate in some embodiments. The substrate 1510, in some embodiments, further comprises a plurality of isolation features (not shown), such as shallow trench isolation (STI) features or local oxidation of silicon (LOCOS) features. The isolation features define and isolate various microelectronic elements (not shown). Examples of such various microelectronic elements formed in the substrate 1510 in accordance with some embodiments include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

The substrate 1510 further includes, in some embodiments, inter-layer dielectric layers 1504 and a metallization structure made up of multiple metal layers 1506 overlying the integrated circuits. The inter-layer dielectric layers 1504 in the metallization structure include low-k dielectric materials, un-doped silicate glass (USG), silicon dioxide, silicon nitride, silicon oxynitride, or other commonly used materials. The dielectric constants (k value) of the low-k dielectric materials is, in some embodiments, less than about 3.9, or less than about 2.8. Metal lines 1506 in the metallization structure are, in some embodiments, formed of copper or copper alloys.

A contact pad 1512, which is one example of a conductive pad, is a top metallization layer formed in a top-level inter-layer dielectric layer, which is a portion of conductive routes and has an exposed surface treated by a planarization process, such as chemical mechanical polishing (CMP), in some embodiments. Suitable materials for the contact pad 1512 include, but are not limited to, for example, copper (Cu), aluminum (Al), AlCu, copper alloy, or other conductive materials. In one embodiment, the contact pad 1512 is made of metal (e.g., Al), which is, in some embodiments, used in the bonding process to connect the integrated circuits in the respective chip to external features.

A passivation layer 1514 is formed on the substrate 1510 and patterned to expose a portion of the contact pad 1512 for allowing subsequent post passivation interconnect processes. In one embodiment, the passivation layer 1514 is formed of a non-organic material selected from un-doped silicate glass (USG), silicon nitride, silicon oxynitride, silicon oxide, and combinations thereof. In another embodiment, the passivation layer 1514 is formed of a polymer layer, such as an epoxy, polyimide, benzocyclobutene (BCB), polybenzoxazole (PBO), and the like, although other relatively soft, often organic, dielectric materials are also usable.

A post passivation interconnect (PPI) process is then performed on the passivation layer 1514. In some embodiments, an adhesion layer and/or a seed layer (1515) are formed on the passivation layer 1514. The adhesion layer, also referred to as a glue layer, is blanket formed, covering the passivation layer 1514. The adhesion layer includes commonly used barrier materials such as titanium, titanium nitride, tantalum, tantalum nitride, and combinations thereof, and is formed using physical vapor deposition, sputtering, or the like. The adhesion layer helps to improve the adhesion of the subsequently formed conductive lines onto passivation layer 1514. The seed layer is blanket formed on the adhesion layer. The materials of the seed layer include aluminum, aluminum, alloys copper, copper alloys, silver, gold, aluminum, and combinations thereof. In an embodiment, the seed layer is formed of sputtering. In other embodiments, other commonly used methods such as physical vapor deposition or electroless plating are used.

A post passivation interconnect (PPI) line 1518 is formed on the adhesion layer and/or seed layer (1515, if used). Using a mask and a photolithography process, a conductive material fills an opening of the mask, followed by removing the mask and any exposed portions of the adhesion layer and seed layer. The removal includes a wet etching process or a dry etching process. In one embodiment, the removal includes an isotropic wet etching using an ammonia-based acid, which is, in some embodiments, a flash etching with a short duration.

The conductive material filling serves as the PPI line 1518. The PPI line 1518 includes, but is not limited to, for example, copper, aluminum, copper alloy, or other conductive materials. The PPI line 1518 further includes, in some embodiments, a nickel-containing layer (not shown) on the top of a copper-containing layer. The PPI formation methods include plating, electroless plating, sputtering, chemical vapor deposition methods, and the like. The PPI line 1518 connects the contact pad 1512 to bump features. The PPI line 1518 also functions, in some embodiments, as power lines, re-distribution lines (RDL), inductors, capacitors or any passive components. The PPI line 1518 in some embodiments has a thickness less than about 30 μm, for example, between about 2 μm and about 25 μm.

A dielectric layer (not shown), also referred to as an isolation layer or a passivation layer, is formed in some embodiments on the exposed passivation layer 1514 and the PPI line 1518. The dielectric layer is formed of dielectric materials such as silicon nitride, silicon carbide, silicon oxynitride or other applicable materials. The formation methods include plasma enhance chemical vapor deposition (PECVD) or other commonly used CVD methods.

A polymer layer 1522 is formed on the dielectric layer. Lithography technology and etching processes such as a dry etch and/or a wet etch process, are then performed to pattern the polymer layer 1522, thus an opening is formed to pass through the polymer layer 1522 and expose a portion of the PPI line 1518 for allowing subsequent bump process. The polymer layer 1522, as the name suggests, is formed of a polymer, such as an epoxy, polyimide, benzocyclobutene (BCB), polybenzoxazole (PBO), and the like, although other relatively soft, often organic, dielectric materials can also be used. In one embodiment, the polymer layer 1522 is a polyimide layer. In another embodiment, the polymer layer 1522 is a polybenzoxazole (PBO) layer. The polymer layer 1522 is soft, and hence has the function of reducing inherent stresses on respective substrate. In addition, the polymer layer 1522 is easily formed to a thickness of tens of microns.

An under-bump-metallurgy (UBM) layer 1524 that includes, in some embodiments, a diffusion barrier layer and a seed layer are formed. The UBM layer 1524 is formed on the polymer layer 1522 and the exposed portion of the PPI line 1518, and lines the sidewalls and bottom of the opening 1523. The diffusion barrier layer, also referred to as a glue layer, is formed to cover the sidewalls and the bottom of the opening. The diffusion barrier layer is, in some embodiments, formed of tantalum nitride, titanium nitride, tantalum, titanium, or the like. The formation methods include physical vapor deposition (PVD) or sputtering. The seed layer is, in some embodiments, a copper seed layer formed on the diffusion barrier layer. The seed layer is, in some embodiments, formed of copper alloys that include silver, chromium, nickel, tin, gold, and combinations thereof. In one embodiment, the UBM layer 1524 includes a diffusion barrier layer formed of Ti and a seed layer formed of Cu.

A mask layer (not shown) is provided on the UBM layer 1524 and patterned for exposing a portion of the UBM layer 1524 for bump formation. A conductive material with solder wettability, such as SnAg, or other lead-free or lead-containing solder materials, is deposited on the exposed portion, thereby forming a bump (or ball) 1506, which can also be referred to as a conductive contact pad in some embodiments and which is in contact with the underlying UBM layer 1524. The bump 1506 defines a connection ball for the semiconductor device 1500.

Thus, some embodiments of the present disclosure relate to a semiconductor device on a semiconductor substrate. An interconnect structure is disposed over the semiconductor substrate, and a first conductive pad is disposed over the interconnect structure. A second conductive pad is disposed over the interconnect structure and is spaced apart from the first conductive pad. A third conductive pad is disposed over the interconnect structure and is spaced apart from the first and second conductive pads. A fourth conductive pad is disposed over the interconnect structure and is spaced apart from the first, second, and third conductive pads. A first ESD protection element is electrically coupled between the first and second conductive pads; and a second ESD protection element is electrically coupled between the third and fourth conductive pads. A first device under test is electrically coupled between the first and third conductive pads; and a second device under test is electrically coupled between the second and fourth conductive pads.

In other embodiments, the present disclosure relates to a method of testing a semiconductor device. In this method, the semiconductor device is subjected to an electrostatic discharge (ESD) prone environment during manufacturing or testing. After the semiconductor device has been exposed to the ESD prone environment, the first fuse and second fuse are blown away. After blowing away the first and second fuses, an electro-migration test is conducted by applying electrical stress to the first device under test or to the second device under test.

In still other embodiments, the present disclosure relates to.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a semiconductor substrate;
    an interconnect structure disposed over the semiconductor substrate;
    a first conductive pad disposed over the interconnect structure;
    a second conductive pad disposed over the interconnect structure and spaced apart from the first conductive pad;
    a third conductive pad disposed over the interconnect structure and spaced apart from the first and second conductive pads;
    a first ESD protection element electrically coupled between the first and second conductive pads; and
    a first device under test (DUT) electrically coupled between the first and third conductive pads.

2. The semiconductor device of claim 1, further comprising a fourth conductive pad disposed over the interconnect structure and spaced apart from the first, second, and third conductive pads.

3. The semiconductor device of claim 2, further comprising: a second ESD protection element electrically coupled between the third and fourth conductive pads.

4. The semiconductor device of claim 2, further comprising: a second DUT electrically coupled between the second and fourth conductive pads.

5. The semiconductor device of claim 1 wherein the first DUT is a first metal 1 line.

6. The semiconductor device of claim 5, wherein the first metal 1 line has a first resistance, and the first ESD protection element has a second resistance that is less than the first resistance.

7. The semiconductor device of claim 1, wherein the first ESD protection element includes a first fuse.

8. The semiconductor device of claim 1, wherein the first ESD protection element comprises:
    a first fuse coupled between the first conductive pad and the second conductive pad;
    a first diode in series with the first fuse, the first diode having a cathode coupled to the first conductive pad and an anode coupled to the first fuse; and
    a second diode in series with the first fuse and the first diode, the second diode having a cathode coupled to the second conductive pad and an anode coupled to the first fuse.

9. The semiconductor device of claim 1, wherein the first DUT comprises:
    a metal 1 line which is electrically isolated from the semiconductor substrate; and
    first and second vias which are in direct contact with an upper surface region of the metal 1 line;
    wherein the metal 1 line has a first width in a DUT region of the metal 1 line arranged between the first and second vias, and wherein the metal 1 line tapers outwardly to have a second width under the first and second vias, the second width being greater than the first width.

10. An integrated circuit (IC) chip, comprising:
    a plurality of semiconductor devices disposed in or on a semiconductor substrate;
    a first conductive pad on a surface of the IC chip and configured to couple a first device under test (DUT) on the semiconductor substrate to a wafer probe of an external testing apparatus, wherein the first DUT is coupled to the first conductive pad;
    a second conductive pad spaced apart from the first conductive pad and configured to couple a second DUT on the semiconductor substrate to a wafer probe of the external testing apparatus;
    a first ESD protection element electrically coupled between the first and second conductive pads.

11. The IC of claim 10, further comprising: a third conductive pad spaced apart from the first and second conductive pads and configured to be coupled to a wafer probe of the external testing apparatus, wherein the first DUT is coupled between the first conductive pad and the third conductive pad.

12. The IC of claim 11, further comprising: a fourth conductive pad spaced apart from the first, second, and third conductive pads, and configured to be coupled to a wafer probe of the external testing apparatus, wherein the second DUT is coupled between the second and fourth conductive pads.

13. The IC of claim 12, further comprising: a second ESD protection element electrically coupled between the third and fourth conductive pads.

14. The IC of claim 10, wherein the first DUT comprises:
a metal 1 line which is electrically isolated from the plurality of semiconductor devices and the semiconductor substrate; and
first and second vias which are in direct contact with an upper surface region of the metal 1 line;
wherein the metal 1 line has a first width in a DUT region of the metal 1 line arranged between the first and second vias, and wherein the metal 1 line tapers outwardly to have a second width under the first and second vias, the second width being greater than the first width.

15. The IC of claim 14, wherein the first width is approximately 20 nanometers or less, and the second width is at least twice as large as the first width.

16. The IC of claim 10, wherein the first DUT comprises:
first and second DUT terminals each corresponding to a separate metal 1 terminal line having a first width;
a plurality of metal 1 test lines each extending in a first direction and having a second width less than the first width and being arranged in parallel with one another, wherein neighboring metal 1 test lines of the plurality of metal 1 test lines are spaced apart from one another in a second direction, which is perpendicular to the first direction, at a regular interval;
a first metal 1 coupling line coupling at least some of the metal 1 test lines to the first DUT terminal; and
a second metal 1 coupling line coupling at least some of the metal 1 test lines to the second DUT terminal.

17. A semiconductor device, comprising:
a semiconductor substrate;
a interconnect structure disposed over the semiconductor substrate;
a first conductive pad disposed over the interconnect structure;
a second conductive pad disposed over the interconnect structure and spaced apart from the first conductive pad;
a first device under test (DUT) electrically coupled between the first and second conductive pads, wherein the first DUT comprises:
a metal line which is electrically isolated from the semiconductor substrate, wherein the metal line has a first width in a DUT region of the metal line, and wherein the metal line tapers outwardly to have a second width, the second width being greater than the first width.

18. The semiconductor device of claim 17, further comprising:
a third conductive pad disposed over the interconnect structure and spaced apart from the first conductive pad; and
a first ESD protection element electrically coupled between the first conductive pad and the third conductive pad.

19. The semiconductor device of claim 17, further comprising:
first and second vias which are in direct contact with an upper surface region of the metal 1 line;
wherein the DUT region of the metal line in which the metal line has the first width is arranged between the first and second vias, and wherein the metal line tapers outwardly to have the second width under the first and second vias, the second width being greater than the first width.

20. The semiconductor device of claim 19, wherein the first width is approximately 20 nanometers or less, and the second width is at least twice as large as the first width.

* * * * *